(12) United States Patent
Kawahara et al.

(10) Patent No.: US 11,810,708 B2
(45) Date of Patent: Nov. 7, 2023

(54) ELECTRONIC COMPONENT AND COIL COMPONENT

(71) Applicant: TDK CORPORATION, Tokyo (JP)

(72) Inventors: Takahiro Kawahara, Tokyo (JP); Manabu Ohta, Tokyo (JP); Kenei Onuma, Tokyo (JP); Yuuya Kaname, Tokyo (JP); Ryo Fukuoka, Tokyo (JP); Hokuto Eda, Tokyo (JP); Masataro Saito, Tokyo (JP); Kohei Takahashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 18/119,457

(22) Filed: Mar. 9, 2023

(65) Prior Publication Data

US 2023/0215617 A1 Jul. 6, 2023

Related U.S. Application Data

(62) Division of application No. 16/811,610, filed on Mar. 6, 2020, now Pat. No. 11,631,529.

(30) Foreign Application Priority Data

Mar. 19, 2019 (JP) .................................. 2019-050780
Mar. 19, 2019 (JP) .................................. 2019-050781
Mar. 19, 2019 (JP) .................................. 2019-050782

(51) Int. Cl.
*H05K 1/18* (2006.01)
*H01F 27/29* (2006.01)
(Continued)

(52) U.S. Cl.
CPC ....... *H01F 27/292* (2013.01); *H01F 17/0013* (2013.01); *H01F 17/04* (2013.01);
(Continued)

(58) Field of Classification Search
CPC ... H05K 1/181; H01F 27/292; H01F 27/2809; H01F 17/0013; H01F 41/041
See application file for complete search history.

(56) References Cited

U.S. PATENT DOCUMENTS 7,666,718 B2    2/2010  Suzawa et al.
10,847,307 B1 * 11/2020 Tajima ................. H01F 41/043
(Continued)

FOREIGN PATENT DOCUMENTS

CN    104078192 A    10/2014
CN    105513746 A     4/2016
(Continued)

OTHER PUBLICATIONS

Jul. 20, 2023 Office Action Issued In U.S. Appl. No. 18/119,473.

*Primary Examiner* — Hoa C Nguyen
(74) *Attorney, Agent, or Firm* — Oliff PLC

(57) ABSTRACT

In an electronic component, a terminal electrode has a thickest portion and a part thinner than the thickest portion. Accordingly, an increase in solder fillet forming region occurs when the electronic component is solder-mounted onto a predetermined mounting substrate. In the electronic component, mounting strength is improved as a result of the increase in solder fillet forming region. In addition, in the electronic component, the thickest portion overlaps a bump electrode in a direction orthogonal to the lower surface of an element body. Accordingly, the impact that is applied to the electronic component during the mounting onto the mounting substrate is reduced and the impact resistance of the electronic component is improved.

8 Claims, 11 Drawing Sheets

(51) Int. Cl.
  *H01F 17/00* (2006.01)
  *H01F 17/04* (2006.01)
  *H01F 41/04* (2006.01)
  *H01F 27/28* (2006.01)

(52) U.S. Cl.
  CPC ....... *H01F 27/2804* (2013.01); *H01F 41/041* (2013.01); *H05K 1/181* (2013.01); *H01F 2017/048* (2013.01)

(56) References Cited

U.S. PATENT DOCUMENTS

| | | |
|---|---|---|
| 2013/0223033 A1 | 8/2013 | Mano et al. |
| 2014/0009254 A1 | 1/2014 | Ohkubo et al. |
| 2014/0292466 A1 | 10/2014 | Watanabe et al. |
| 2015/0145629 A1 | 5/2015 | Chang et al. |
| 2015/0357115 A1 | 12/2015 | Ohkubo et al. |
| 2016/0104565 A1 | 4/2016 | Nishiyama |
| 2016/0336110 A1* | 11/2016 | Kitajima ................. H01F 17/04 |
| 2017/0162317 A1 | 6/2017 | Taniguchi et al. |
| 2017/0200554 A1 | 7/2017 | Kudo et al. |
| 2017/0221622 A1 | 8/2017 | Park et al. |
| 2017/0236632 A1 | 8/2017 | Park et al. |
| 2017/0236633 A1 | 8/2017 | Park et al. |
| 2017/0256353 A1 | 9/2017 | Park et al. |
| 2017/0263367 A1 | 9/2017 | Park et al. |
| 2017/0263370 A1 | 9/2017 | Park et al. |
| 2017/0352475 A1 | 12/2017 | Ishida |
| 2018/0182535 A1 | 6/2018 | Tachibana |
| 2018/0182536 A1 | 6/2018 | Tachibana |
| 2018/0197674 A1* | 7/2018 | Yoshinaka .......... H01F 27/2885 |
| 2018/0277296 A1* | 9/2018 | Endo ..................... H01F 27/292 |
| 2019/0013148 A1 | 1/2019 | Ohkubo et al. |
| 2019/0066908 A1 | 2/2019 | Ueda et al. |
| 2019/0074137 A1 | 3/2019 | Lee et al. |
| 2019/0115150 A1 | 4/2019 | Yoshioka et al. |
| 2020/0082986 A1 | 3/2020 | Yaso |
| 2020/0098508 A1 | 3/2020 | Park et al. |
| 2021/0241962 A1 | 8/2021 | Taniguchi et al. |

FOREIGN PATENT DOCUMENTS

| | | |
|---|---|---|
| CN | 107039140 A | 8/2017 |
| CN | 109243789 A | 1/2019 |
| JP | 6024243 B2 | 11/2016 |
| JP | 2017-103354 A | 6/2017 |
| JP | 2017-528001 A | 9/2017 |
| JP | 2018-107411 A | 7/2018 |
| JP | 2018-107412 A | 7/2018 |
| JP | 2018-170320 A | 11/2018 |
| WO | 2018/216452 A1 | 11/2018 |

\* cited by examiner

ELECTRONIC COMPONENT AND COIL COMPONENT

CROSS-REFERENCE TO RELATED APPLICATIONS

This is a Division of application Ser. No. 16/811,610 filed Mar. 6, 2020, which claims the benefit of priority from Japanese Patent Applications No. 2019-50780, No. 2019-50781, and No. 2019-50782, filed on 19 Mar. 2019, the entire contents of which are incorporated herein by reference.

TECHNICAL FIELD

The present disclosure relates to an electronic component and a coil component.

BACKGROUND

In recent years, development of a bottom surface terminal-type coil component (a type of electronic component) in which a terminal electrode is provided only on the bottom surface of a chip has been promoted so that high-density mounting is coped with. Japanese Unexamined Patent Publication No. 2017-528001 (Patent Literature 1) discloses a bottom surface terminal-type electronic component provided with a substrate extending in parallel to a bottom surface provided with a terminal electrode, in which coil patterns are formed on both surfaces of the substrate.

SUMMARY

Technical Problem

The inventors have conducted research on the structure of the bottom surface of an electronic component. As a result, the inventors have newly found a technique with which impact resistance can be improved while the mounting strength of the electronic component during mounting onto on a mounting substrate is improved.

Provided according to the present disclosure is an electronic component and a coil component with which impact resistance can be improved along with mounting strength.

Solution to Problem

An electronic component according to an aspect of the present disclosure includes an element body having a lower surface configured to face a mounting substrate, an inner conductor disposed in the element body and having a first end portion and a second end portion, a pair of terminal electrodes provided on the lower surface of the element body, and a pair of bump electrodes extending in a direction intersecting with the lower surface of the element body and respectively interconnecting the first and second end portions of the inner conductor and the pair of terminal electrodes. The terminal electrode has a thickest portion where a thickness with respect to the lower surface of the element body is largest and a part thinner than the thickest portion and the thickest portion overlaps the bump electrode in a direction orthogonal to the lower surface.

In the electronic component described above, the terminal electrode has the thickest portion and the part thinner than the thickest portion. Accordingly, an increase in solder fillet forming region occurs when a coil component is solder-mounted onto a predetermined mounting substrate. Mounting strength is improved as a result of the increase in solder fillet forming region. In addition, in the electronic component described above, the thickest portion overlaps the bump electrode in the direction orthogonal to the lower surface. Accordingly, the impact that is applied to the electronic component during the mounting onto the mounting substrate is reduced and the impact resistance of the electronic component is improved.

The electronic component according to another aspect further includes a recess portion provided in the lower surface and positioned between the pair of terminal electrodes. A part of the terminal electrode is provided in the recess portion.

In the electronic component according to another aspect, the recess portion has a slope inclined with respect to the lower surface and is continuous with the lower surface on the slope.

In the electronic component according to another aspect, the bump electrode has an enlarged portion and a cross-sectional dimension of the enlarged portion in a plane orthogonal to the lower surface gradually increases toward the lower surface of the element body.

DETAILED DESCRIPTION

Figure 1:
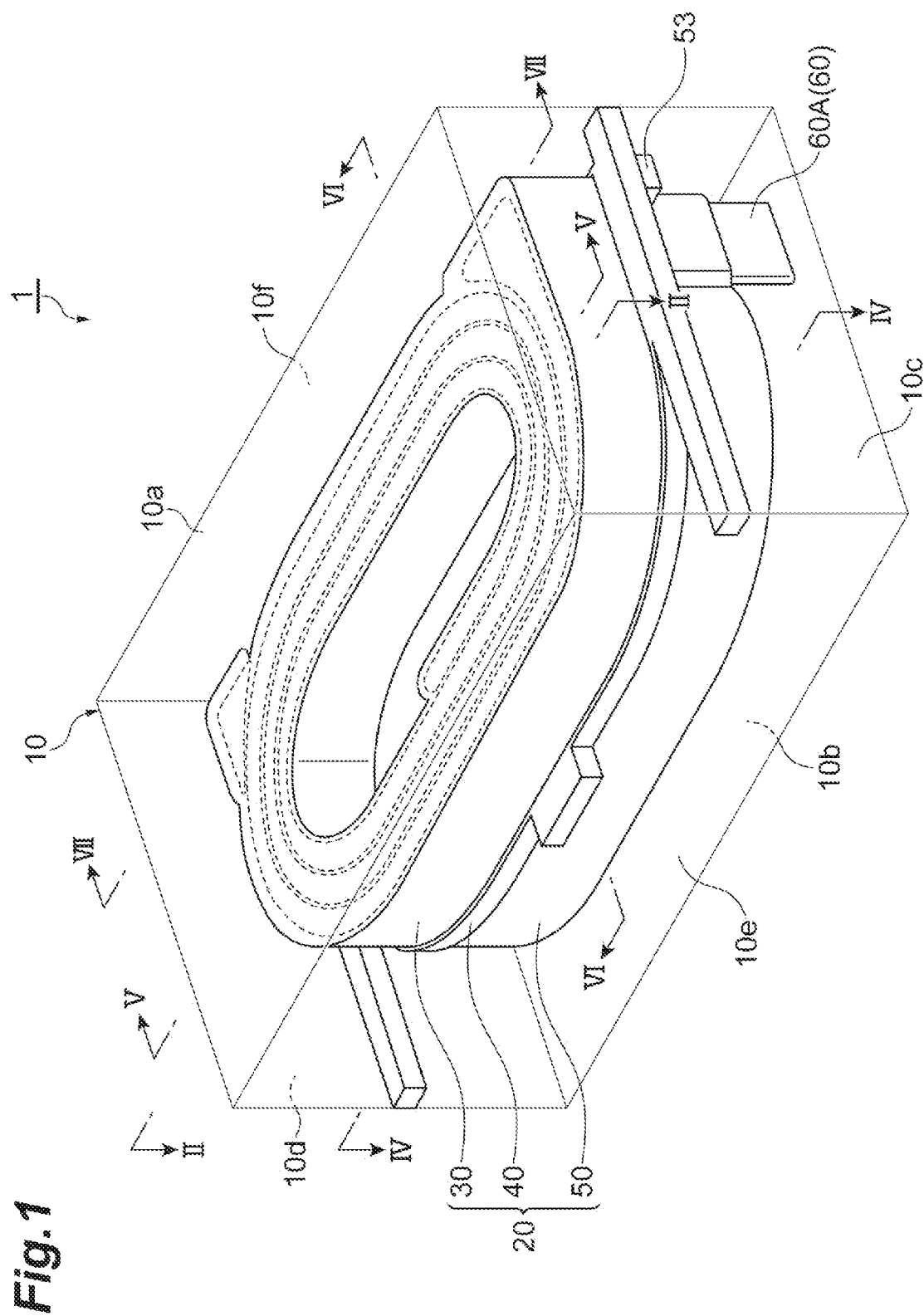
FIG. 1 is a schematic perspective view illustrating a coil component according to an embodiment.

Hereinafter, various embodiments and examples will be described with reference to the drawings. The same or corresponding parts will be denoted by the same reference numerals in the drawings and redundant description will be omitted.

A coil component 1 as a type of electronic component will be described in the present embodiment. As illustrated in FIG. 1, the coil component 1 according to the embodiment has a rectangular parallelepiped outer shape. The coil component 1 can be designed so as to have, for example, a long side dimension of 1.2 mm, a short side dimension of 1.0 mm, and a height dimension of 0.5 mm. Alternatively, as another example, the coil component 1 can be designed so as to have a long side dimension of 2.0 mm, a short side dimension of 1.2 mm, and a height dimension of 0.6 mm.

The coil component 1 is configured to be provided with an element body 10 and a coil portion 20 embedded in the element body 10.

The element body 10 has a rectangular parallelepiped outer shape and has six surfaces 10a to 10f. As for the surfaces 10a to 10f of the element body 10, the upper surface 10a and the lower surface 10b are parallel to each other, the end surfaces 10c and 10d are parallel to each other, and the side surfaces 10e and 10f are parallel to each other. The lower surface 10b of the element body 10 faces a mounting surface of a mounting substrate onto which the coil component 1 is mounted in parallel to the mounting surface.

A magnetic material constitutes the element body 10. In the present embodiment, a metal magnetic powder-containing resin as a type of magnetic material constitutes the element body 10. The metal magnetic powder-containing resin is binder powder in which metal magnetic powder is bound by a binder resin. The metal magnetic powder can be made of, for example, an iron-nickel alloy (permalloy alloy), carbonyl iron, an amorphous, non-crystalline, or crystalline FeSiCr-based alloy, sendust, or the like. The binder resin is, for example, a thermosetting epoxy resin. In the present embodiment, the content of the metal magnetic powder in the binder powder is 80 to 92 vol % in volume percent and 95 to 99 wt % in mass percent. From the viewpoint of magnetic properties, the content of the metal magnetic powder in the binder powder may be 85 to 92 vol % in volume percent and 97 to 99 wt % in mass percent.

The coil portion 20 is configured to be provided with a first coil body 30, a substrate 40, and a second coil body 50. Specifically, the first coil body 30 is provided on an upper surface 40a of the substrate 40 positioned on the upper surface side of the element body 10 and the second coil body 50 is provided on a lower surface 40b of the substrate 40 positioned on the lower surface side of the element body 10. In the present embodiment, the pattern shape of the first coil body 30 viewed from the upper surface 40a side of the substrate 40 is the same as the pattern shape of the second coil body 50 viewed from the lower surface 40b side of the substrate 40.

Figure 3:
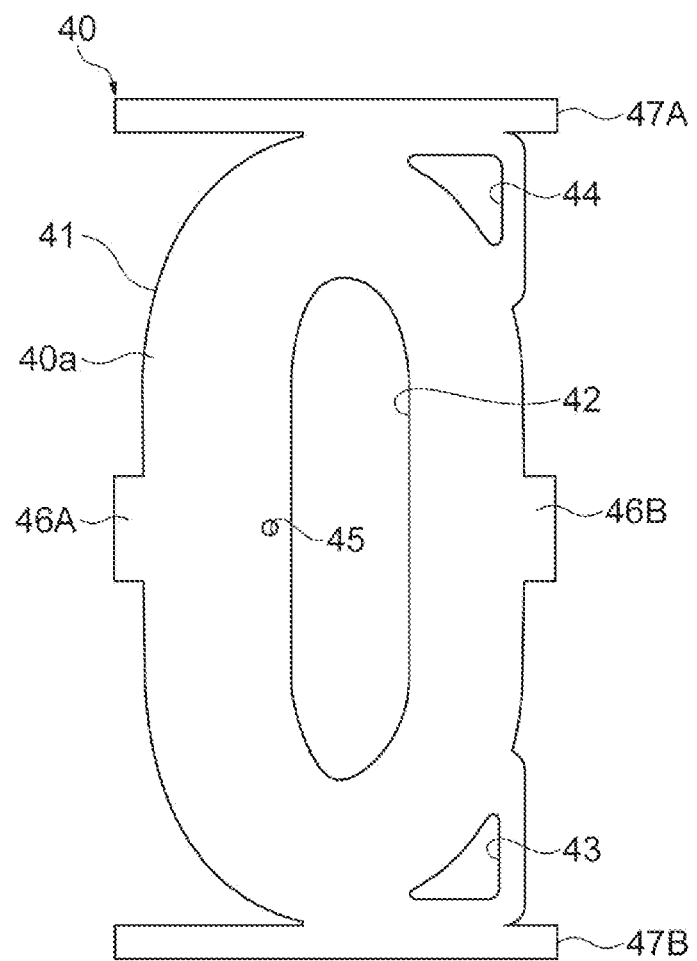
FIG. 3 is a plan view illustrating a substrate of the coil component illustrated in FIG. 1.

The substrate 40 is a plate-shaped member extending in parallel to the upper surface 10a and the lower surface 10b of the element body 10. The substrate 40 is disposed such that the distance between the substrate 40 and the lower surface 10b of the element body 10 is shorter than the distance between the substrate 40 and the upper surface 10a of the element body 10. As illustrated in FIG. 3, the substrate 40 has an elliptical ring-shaped coil forming portion 41 extending along the long side direction of the element body 10, a pair of projection portions 46A and 46B respectively extending from the coil forming portion 41 to the side surfaces 10e and 10f of the element body 10, and a pair of frame portions 47A and 47B extending along the short side direction of the element body 10 and sandwiching the coil forming portion 41 from both sides. The substrate 40 is provided with substantially triangular through holes 43 and 44 in the regions that are defined by the outer periphery of the coil forming portion 41 and the pair of frame portions 47A and 47B, respectively. In addition, the coil forming portion 41 is provided with a circular through hole 45 in an edge portion of an oval opening 42.

A substrate with a plate thickness of 60 μm in which a glass cloth is impregnated with cyanate resin (Bismaleimide Triazine (BT) resin: registered trademark) can be used as the substrate 40. Polyimide, aramid, and so on can be used besides the BT resin. Ceramic or glass can also be used as a material of the substrate 40. A material of the substrate 40 may be a mass-produced printed board material. Particularly, a material of the substrate 40 may be a resin material used for a BT printed board, an FR4 printed board, or an FR5 printed board.

Figure 2:
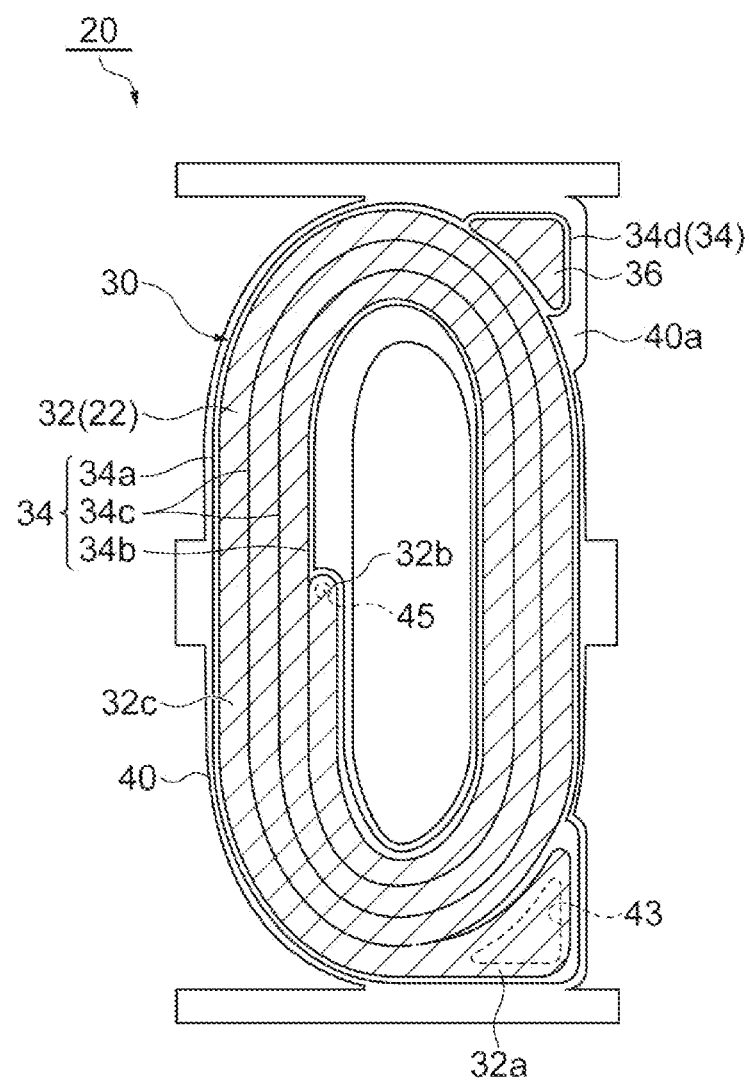
FIG. 2 is a cross-sectional view of the coil component taken along line II-II in FIG. 1.

The first coil body 30 is provided on the upper surface 40a of the substrate 40 in the coil forming portion 41. As illustrated in FIG. 2, the first coil body 30 is configured to be provided with a first planar coil 32 constituting a part of a coil 22 (inner conductor) of the coil component 1, a first insulator 34, and a first island-shaped electrode 36.

The first planar coil 32 is a substantially oval spiral air core coil wound around the opening 42 of the coil forming portion 41 in the same layer on the upper surface 40a of the substrate 40. The number of turns of the first planar coil 32 may be one or a plurality of turns. In the present embodiment, the number of turns of the first planar coil 32 is three to four. The first planar coil 32 has an outside end portion 32a (first extracting end portion), an inside end portion 32b (first connection end portion), and a first turn portion 32c interconnecting the outside end portion 32a and the inside end portion 32b. The outside end portion 32a is provided in the region that covers the through hole 43 of the substrate 40 when viewed from the thickness direction of the substrate 40 and has a substantially triangular shape. More specifically, the outside end portion 32a has a rounded triangular shape. Even more specifically, the side surface on the inner peripheral side of the outside end portion 32a faces the first turn portion 32c and is curved in a circular arc shape so as to be along the outer peripheral surface of the first turn portion 32c. The inside end portion 32b is provided in the region that covers the through hole 45 of the substrate 40 when viewed from the thickness direction of the substrate 40 and has a circular shape. The first planar coil 32 is made of, for example, Cu and can be formed by electrolytic plating.

The first island-shaped electrode 36 is provided in the region that overlaps the through hole 44 of the substrate 40 when viewed from the thickness direction of the substrate 40 and has a substantially triangular shape. More specifically, the first island-shaped electrode 36 has a rounded triangular shape. Even more specifically, the side surface on the inner peripheral side of the first island-shaped electrode 36 faces the first turn portion 32c and is curved in a circular arc shape so as to be along the outer peripheral surface of the first turn portion 32c. The first island-shaped electrode 36 is not in contact with the first planar coil 32 on the upper surface 40a of the substrate 40. The first island-shaped electrode 36 is a dummy electrode that is not necessary for constituting the circuit of the coil portion 20. The first island-shaped electrode 36 is made of, for example, Cu and can be formed by electrolytic plating.

The first insulator 34 is provided on the upper surface 40a of the substrate 40 and is a thick film resist patterned by known photolithography. The first insulator 34 defines the growth region of the first planar coil 32 and the first island-shaped electrode 36 and covers the first planar coil 32 in the same layer as the layer where the first planar coil 32 is formed. In the present embodiment, the first insulator 34 includes an outer wall 34a and an inner wall 34b defining the contour of the first planar coil 32, a partition wall 34c separating the inside and outside turns of the first turn portion 32c of the first planar coil 32, and an outer wall 34d defining the contour of the first island-shaped electrode 36. The first insulator 34 is made of, for example, an epoxy resin.

Figure 5:
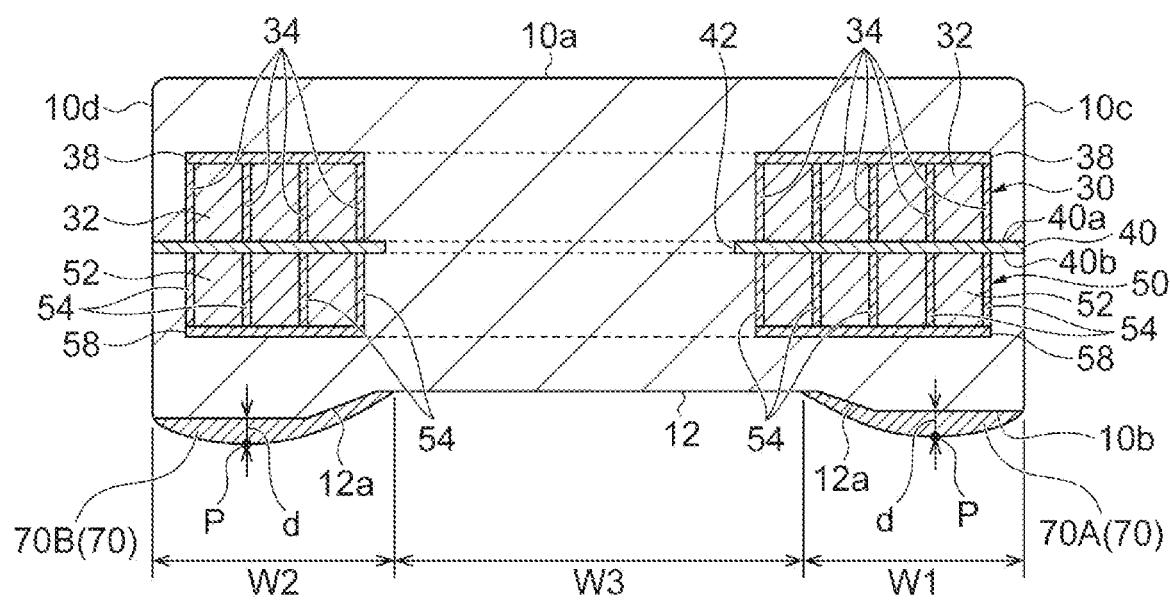
FIG. 5 is a cross-sectional view of the coil component taken along line V-V in FIG. 1.

As illustrated in FIG. 5, the first coil body 30 further includes a protective film 38 integrally covering the first planar coil 32 and the first insulator 34 from the upper surface 10a side of the element body 10. The protective film 38 is made of, for example, an epoxy resin. The protective film 38 enhances the insulation between the first planar coil 32 and the metal magnetic powder contained in the element body 10.

Figure 4:
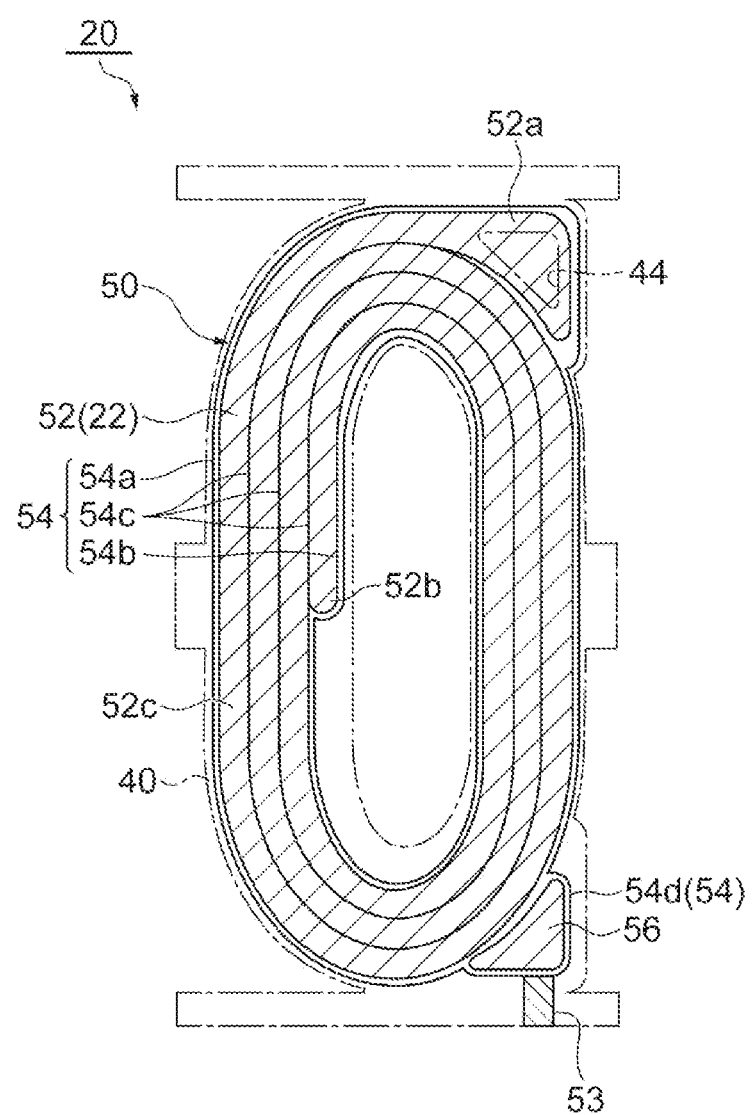
FIG. 4 is a cross-sectional view of the coil component taken along line IV-IV in FIG. 1.

The second coil body 50 is provided on the lower surface 40b of the substrate 40 in the coil forming portion 41. As illustrated in FIG. 4, the second coil body 50 is configured to be provided with a second planar coil 52 constituting a part of the coil 22 of the coil component 1, a second insulator 54, and a second island-shaped electrode 56.

The second planar coil 52 is a substantially oval spiral air core coil wound around the opening 42 of the coil forming portion 41 in the same layer on the lower surface 40b of the substrate 40. The number of turns of the second planar coil 52 may be one or a plurality of turns. In the present embodiment, the number of turns of the second planar coil 52 is three to four. The second planar coil 52 has an outside end portion 52a (second extracting end portion), an inside end portion 52b (second connection end portion), and a second turn portion 52c interconnecting the outside end portion 52a and the inside end portion 52b. The outside end portion 52a is provided in the region that covers the through hole 44 of the substrate 40 when viewed from the thickness direction of the substrate 40 and has a substantially triangular shape similarly to the outside end portion 32a of the first planar coil 32. In other words, the outside end portion 52a has a rounded triangular shape and the side surface on the inner peripheral side of the outside end portion 52a that faces the second turn portion 52c is curved in a circular arc shape so as to be along the outer peripheral surface of the second turn portion 52c. The inside end portion 52b is provided in the region that covers the through hole 45 of the substrate 40 when viewed from the thickness direction of the substrate 40 and has a circular shape. The second planar coil 52 is made of, for example, Cu and can be formed by electrolytic plating.

The second island-shaped electrode 56 is provided in the region that overlaps the through hole 43 of the substrate 40 when viewed from the thickness direction of the substrate 40 and has a substantially triangular shape similarly to the first island-shaped electrode 36. In other words, the second island-shaped electrode 56 has a rounded triangular shape and the side surface on the inner peripheral side of the second island-shaped electrode 56 that faces the second turn portion 52c is curved in a circular arc shape so as to be along the outer peripheral surface of the second turn portion 52c. The second island-shaped electrode 56 is not in contact with the second planar coil 52 on the lower surface 40b of the substrate 40. The second island-shaped electrode 56 is made of, for example, Cu and can be formed by electrolytic plating.

The second insulator 54 is provided on the lower surface 40b of the substrate 40 and is a thick film resist patterned by known photolithography. The second insulator 54 defines the growth region of the second planar coil 52 and the second island-shaped electrode 56 and covers the second planar coil 52 in the same layer as the layer where the second planar coil 52 is formed. In the present embodiment, the second insulator 54 includes an outer wall 54a and an inner wall 54b defining the contour of the second planar coil 52, a partition wall 54c separating the inside and outside turns of the second turn portion 52c of the second planar coil 52, and an outer wall 54d defining the contour of the second island-shaped electrode 56. The second insulator 54 is made of, for example, an epoxy resin.

As illustrated in FIG. 5, the second coil body 50 further includes a protective film 58 integrally covering the second planar coil 52 and the second insulator 54 from the lower surface 10b side of the element body 10. The protective film 58 is made of, for example, an epoxy resin. The protective film 58 enhances the insulation between the second planar coil 52 and the metal magnetic powder contained in the element body 10.

A conductor 53 connected to the second island-shaped electrode 56 is provided on the lower surface 40b of the substrate 40. As described later, the conductor 53 functions as an electric power supply line when the coil 22 is formed by electrolytic plating. The conductor 53 is provided so as to straddle the coil forming portion 41 and the frame portion 47B. As illustrated in FIG. 1, the conductor 53 is exposed from the end surface 10c of the element body 10. The conductor 53 is electrically connected to the first planar coil 32 and the second planar coil 52 via the second island-shaped electrode 56.

Figure 6:
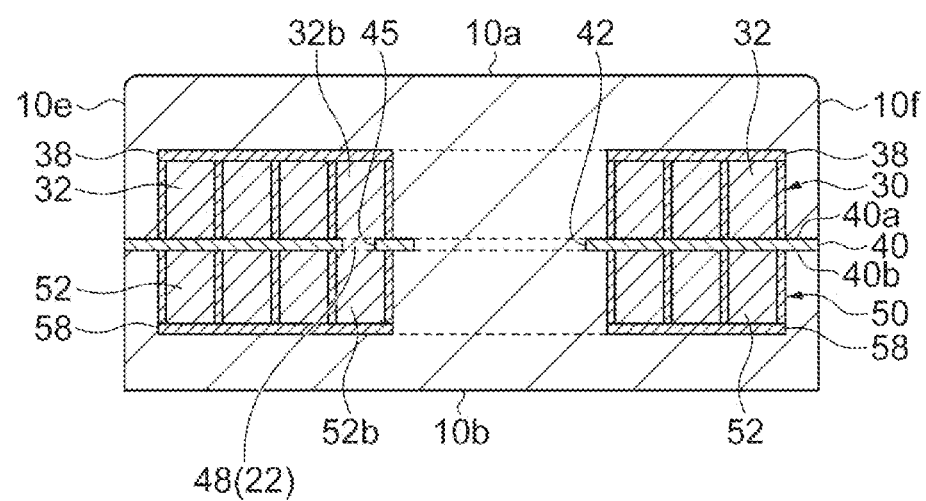
FIG. 6 is a cross-sectional view of the coil component taken along line VI-VI in FIG. 1.

As illustrated in FIG. 6, the through hole 45 of the substrate 40 is filled with a via conductor 48. The respective inside end portions 32b and 52b of the first planar coil 32 provided on the upper surface 40a of the substrate 40 and the second planar coil 52 provided on the lower surface 40b of the substrate 40 are interconnected via the via conductor 48 in the through hole 45 penetrating the substrate 40 in the thickness direction. In the present embodiment, the first planar coil 32, the second planar coil 52, and the via conductor 48 constitute the air core coil 22 around the opening 42 of the substrate 40. The coil 22 has a coil axis parallel to the thickness direction of the substrate 40 (that is, the direction in which the upper surface 10a and the lower surface 10b face each other).

The first planar coil 32 and the second planar coil 52 are wound such that electric currents flow in the same direction (that is, the same circumferential direction when the substrate 40 is viewed from the thickness direction) when a voltage is applied between both end portions of the coil 22 (that is, the outside end portion 32a of the first planar coil 32 and the outside end portion 52a of the second planar coil 52). In the present embodiment, the first planar coil 32 has a clockwise circumferential direction from the outside end portion 32a to the inside end portion 32b as illustrated in FIG. 2 and the second planar coil 52 has a clockwise circumferential direction from the inside end portion 52b to the outside end portion 52a as illustrated in FIG. 4. Electric currents flow in the same direction through the first planar coil 32 and the second planar coil 52, and thus generated magnetic fluxes are superposed and reinforce each other. The coil 22 is covered with the first insulator 34, the second insulator 54, and the protective films 38 and 58, which are the first insulating coatings of the present disclosure. As a result, insulation is achieved between the coil 22 and the element body 10.

Figure 7:
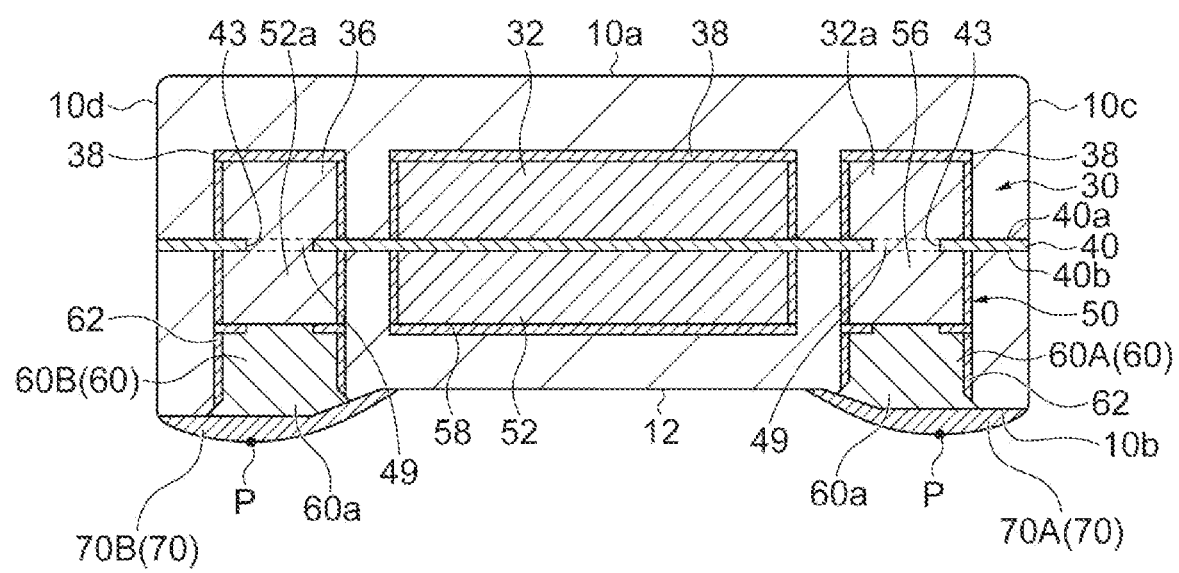
FIG. 7 is a cross-sectional view of the coil component taken along line VII-VII in FIG. 1.

As illustrated in FIG. 7, the through holes 43 and 44 of the substrate 40 are filled with a via conductor 49. The first island-shaped electrode 36 provided on the upper surface 40a of the substrate 40 and the outside end portion 52a of the second planar coil 52 provided on the lower surface 40b of the substrate 40 are interconnected via the via conductor 49 in the through hole 43 penetrating the substrate 40 in the thickness direction. Likewise, the outside end portion 32a of the first planar coil 32 provided on the upper surface 40a of the substrate 40 and the second island-shaped electrode 56 provided on the lower surface 40b of the substrate 40 are interconnected via the via conductor 49 in the through hole 44 penetrating the substrate 40 in the thickness direction.

In the element body 10, a pair of bump electrodes 60 are embedded in addition to the coil portion 20. The pair of bump electrodes 60 extend along the thickness direction of the substrate 40 such that both end portions of the coil 22 are extracted to the lower surface 10*b* of the element body 10. A bump electrode 60A, which is one of the pair of bump electrodes 60 and connected to one end portion 32*a* (first end portion) of the coil 22, extends from the lower surface of the second island-shaped electrode 56 to the lower surface 10*b* of the element body 10 and is electrically connected to one end portion 32*a* of the coil 22 via the second island-shaped electrode 56. A bump electrode 60B, which is the other bump electrode 60 and connected to the other end portion 52*a* of the coil 22, is in direct contact with the other end portion 52*a* (second end portion) of the coil 22 and extends from the lower surface of the other end portion 52*a* of the coil 22 to the lower surface 10*b* of the element body 10.

Figure 8:
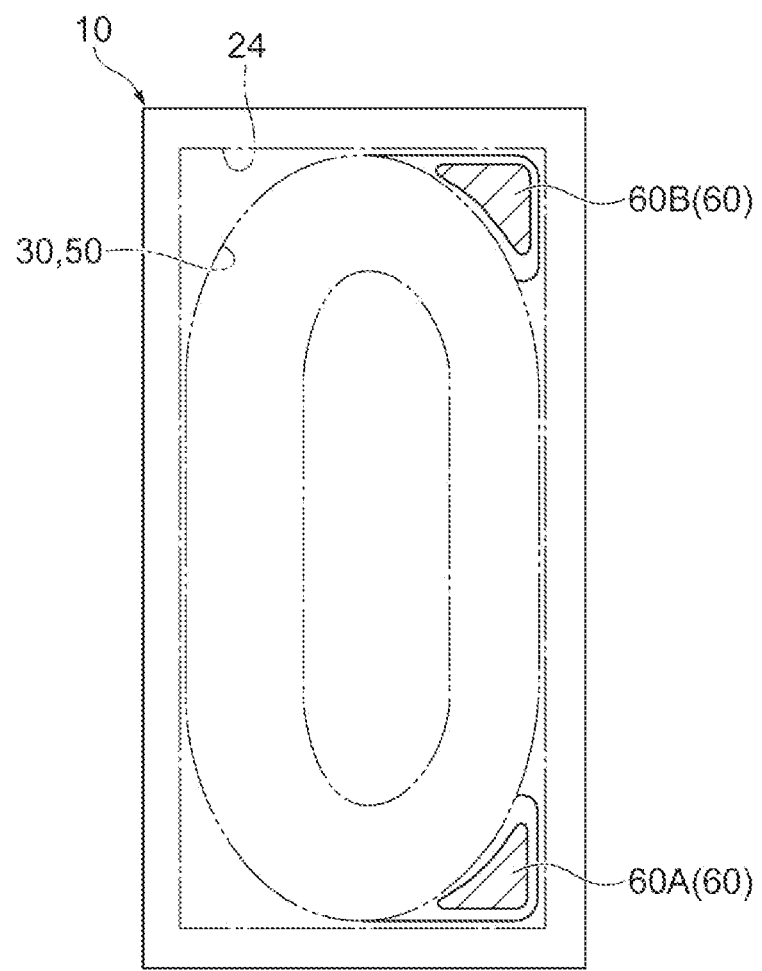
FIG. 8 is a diagram illustrating a positional relationship between bump electrodes.

As illustrated in FIG. 8, each of the pair of bump electrodes 60 is positioned in a corner portion of a rectangular region 24 including the first coil body 30 and the second coil body 50 when viewed from the thickness direction of the substrate 40. The one-dot chain line in FIG. 8 is a virtual line indicating the rectangular region 24. In the present embodiment, the rectangular region 24 circumscribes the first coil body 30 and the second coil body 50 when viewed from the thickness direction of the substrate 40. Each bump electrode 60 has a substantially triangular cross-sectional shape in a plane orthogonal to the thickness direction of the substrate 40. More specifically, the cross-sectional shape of each bump electrode 60 is a triangular shape along the outer periphery of the first coil body 30 or the second coil body 50 and two sides defining a corner portion of the rectangular region 24. For example, the bump electrode 60A has a substantially triangular cross-sectional shape along two sides defining a corner portion of the rectangular region 24 and the outer periphery of the second coil body 50 and the bump electrode 60B has a substantially triangular cross-sectional shape along two sides defining a corner portion of the rectangular region 24 and the outer periphery of the first coil body 30.

Each of the bump electrodes 60A and 60B may have the same cross-sectional shape and the same cross-sectional dimension over the entire length of the substrate 40 in the thickness direction. In the present embodiment, each of the bump electrodes 60A and 60B has an enlarged portion 60*a* at the lower end that is a part near the lower surface 10*b* of the element body 10. In the enlarged portion 60*a*, the cross-sectional dimension (specifically, the cross-sectional dimension in the plane orthogonal to the thickness direction of the substrate 40) gradually increases toward the lower surface 10*b* of the element body 10.

The periphery of each of the bump electrodes 60A and 60B may be covered with an insulator 62 (second insulating coating) over the entire length of the substrate 40 in the thickness direction. The insulator 62 may be made of, for example, an epoxy resin. In the present embodiment, the enlarged portion 60*a* of each of the bump electrodes 60A and 60B is not covered with the insulator 62 and is exposed from the insulator 62. The insulator 62 is provided separately from the second insulator 54.

Neither of the bump electrodes 60 overlaps the first turn portion 32*c* of the first planar coil 32 in the thickness direction of the substrate 40 and neither of the bump electrodes 60 overlaps the second turn portion 52*c* of the second planar coil 52 in the thickness direction of the substrate 40. More specifically, as for each bump electrode 60, at least the end portion on the substrate 40 side (that is, the upper end portion) overlaps neither the first turn portion 32*c* nor the second turn portion 52*c*. In the present embodiment, the enlarged portion 60*a* at the lower end of the bump electrode 60 also overlaps neither the first turn portion 32*c* nor the second turn portion 52*c* in the thickness direction of the substrate 40. In an alternative aspect, the lower end portion of the bump electrode 60 may overlap the first turn portion 32*c* and the second turn portion 52*c* in the thickness direction of the substrate 40.

The through holes 43 and 44 and the via conductor 49 are positioned in corner portions of the rectangular region 24 similarly to the pair of bump electrodes 60. The cross-sectional shape of the via conductor 49 (that is, the opening shape of the through holes 43 and 44) is a substantially triangular shape along the outer periphery of the first coil body 30 or the second coil body 50 and two sides defining a corner portion of the rectangular region 24 similarly to the cross-sectional shape of the pair of bump electrodes 60. The cross-sectional shape of the via conductor 49 may be identical or similar to the cross-sectional shape of the bump electrode 60.

Similarly to the through holes 43 and 44, the outside end portion 32*a* of the first planar coil 32 overlapping the through hole 43 and the outside end portion 52*a* of the second planar coil 52 overlapping the through hole 44 are positioned in corner portions of the rectangular region 24.

Similarly to the pair of bump electrodes 60, the first island-shaped electrode 36 and the second island-shaped electrode 56 are positioned in corner portions of the rectangular region 24. The cross-sectional shape of the first island-shaped electrode 36 and the second island-shaped electrode 56 in the plane orthogonal to the thickness direction of the substrate 40 is a substantially triangular shape along the outer periphery of the first coil body 30 or the second coil body 50 and two sides defining a corner portion of the rectangular region 24. The cross-sectional shape of the first island-shaped electrode 36 and the second island-shaped electrode 56 may be identical or similar to the cross-sectional shape of the bump electrode 60.

The lower surface 10*b* of the element body 10 is provided with a recess portion 12 as illustrated in FIGS. 5 and 7. The recess portion 12 is a part recessed one step with respect to the lower surface 10*b*. The recess portion 12 has a slope 12*a* inclined with respect to the lower surface 10*b* and is continuous with the lower surface 10*b* on the slope 12*a*.

The lower surface 10*b* of the element body 10 is provided with a pair of terminal electrodes 70. The pair of terminal electrodes 70 are respectively connected to the pair of bump electrodes 60 exposed from the lower surface 10*b* of the element body 10. A terminal electrode 70A, which is one of the pair of terminal electrodes 70 and connected to the bump electrode 60A, is provided on the lower surface 10*b* near the end surface 10*c*. A terminal electrode 70B, which is the other terminal electrode 70 and connected to the bump electrode 60B, is provided on the lower surface 10*b* near the end surface 10*d*. The lower end of each bump electrode 60 is the enlarged portion 60*a*, and thus the contact area between the bump electrode 60 and the terminal electrode 70 is increased. A resin electrode constitutes each of the terminal electrodes 70A and 70B and each of the terminal electrodes 70A and 70B can be made of, for example, a resin containing Ag powder.

A part of each of the terminal electrodes 70A and 70B is provided in the recess portion 12. In other words, a part of the terminal electrode 70A and a part of the terminal electrode 70B reach the slope 12a of the recess portion 12 from the vicinity of the end surface 10c and the vicinity of the end surface 10d. Accordingly, a length W1 of the terminal electrode 70A in the direction in which the end surfaces 10c and 10d face each other and a length W2 of the terminal electrode 70B in the direction in which the end surfaces 10c and 10d face each other are longer than in a case where a part of each of the terminal electrodes 70A and 70B does not reach the slope 12a of the recess portion 12. The length W1 of the terminal electrode 70A and the length W2 of the terminal electrode 70B may or may not be equal to each other. In addition, extension between the terminal electrodes 70A and 70B on the lower surface 10b is achieved by the slope 12a of the recess portion 12, and thus a separation distance W3 between the terminal electrodes 70A and 70B does not decrease much even when a part of each of the terminal electrodes 70A and 70B reaches the slope 12a of the recess portion 12. Accordingly, insulation is sufficiently achieved between the terminal electrodes 70A and 70B.

A thickness d of each of the terminal electrodes 70A and 70B with respect to the lower surface 10b is not uniform in the region that corresponds to the bump electrode 60. In other words, each of the terminal electrodes 70A and 70B has a thickest portion P where the thickness d is largest and a part thinner than the thickest portion P. In the terminal electrodes 70A and 70B according to the present embodiment, the thickest portion P is present at the position that overlaps the bump electrode 60 in the thickness direction of the substrate 40 and the thickness d decreases as the distance from the thickest portion P increases. Since the thickness d of each of the terminal electrodes 70A and 70B is not uniform, an increase in solder fillet forming region occurs when the coil component 1 is solder-mounted onto a predetermined mounting substrate such that the lower surface 10b of the element body 10 and the mounting substrate face each other. Mounting strength is improved as a result.

Hereinafter, a procedure for manufacturing the coil component 1 described above will be described with reference to FIGS. 9A to 9C, 10A to 10C, and 11A to 11C.

Figure 9A:
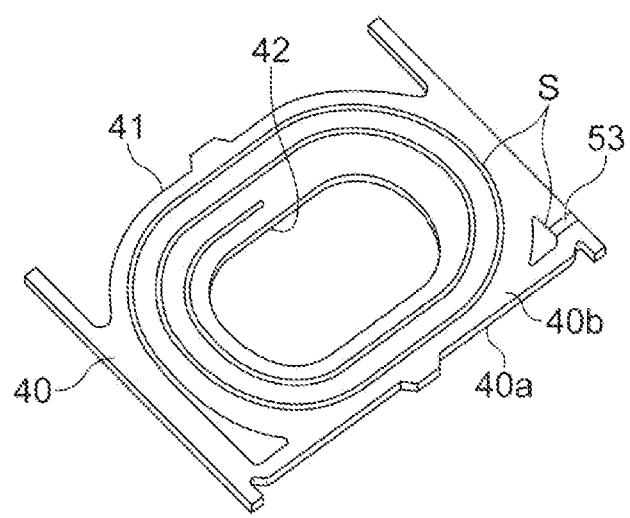
FIGS. 9A to 9C are diagrams illustrating processes of a method for manufacturing the coil component illustrated in FIG. 1.

The substrate 40 is prepared as illustrated in FIG. 9A when the coil component 1 is manufactured. At this time, the substrate 40 is formed on a wafer and a plurality of the substrates 40 are arranged in a matrix form on the wafer. A seed pattern S is formed on both surfaces 40a and 40b of the substrate 40. The seed pattern S includes patterns respectively corresponding to the first planar coil 32, the first island-shaped electrode 36, the second planar coil 52, and the second island-shaped electrode 56. In addition, the conductor 53 connected to the pattern corresponding to the second island-shaped electrode 56 and connected to an electric power source (not illustrated) is provided on the lower surface 40b of the substrate 40. Further, the through holes 43, 44, and 45 described above are provided in the substrate 40 and the through holes 43, 44, and 45 are respectively filled with the via conductors 48 and 49. The through holes 43, 44, and 45 and the via conductors 48 and 49 are not illustrated in FIG. 9A.

Figure 9B:
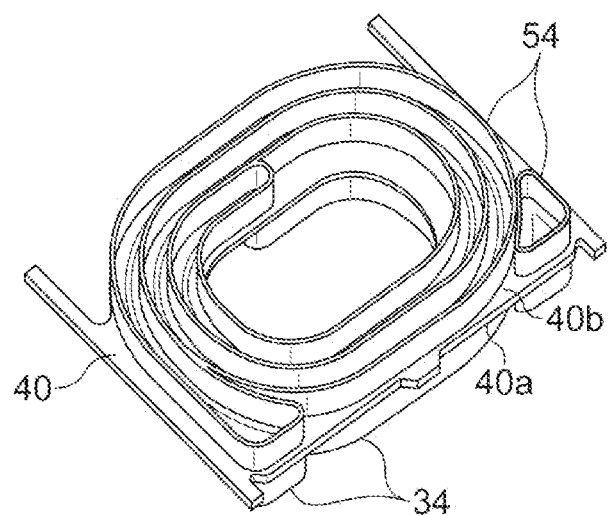

The first insulator 34 and the second insulator 54 are subsequently formed on both surfaces 40a and 40b of the substrate 40 as illustrated in FIG. 9B. The first insulator 34 and the second insulator 54 can be formed by a thick film resist being patterned by known photolithography. The first insulator 34 is formed so as to surround the seed pattern S corresponding to the first planar coil 32 and the first island-shaped electrode 36 and the second insulator 54 is formed so as to surround the seed pattern S corresponding to the second planar coil 52 and the second island-shaped electrode 56.

Figure 9C:
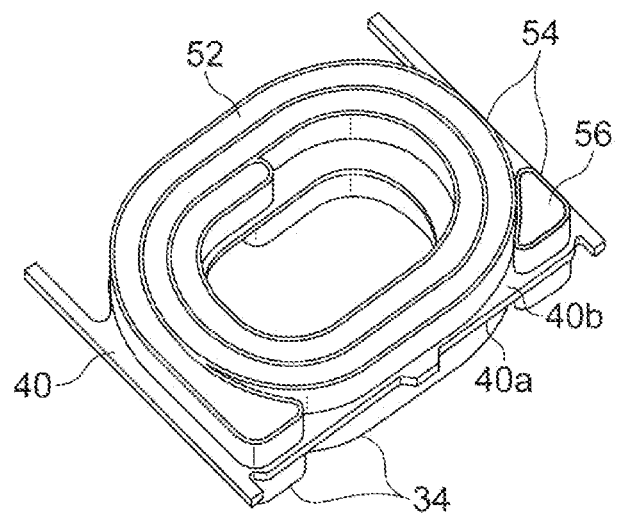

Next, as illustrated in FIG. 9C, the first planar coil 32, the first island-shaped electrode 36, the second planar coil 52, and the second island-shaped electrode 56 are respectively formed by electrolytic plating of Cu being performed while electric power is supplied from the conductor 53 to a seed pattern 51. At this time, the space defined by the first insulator 34 and the second insulator 54 is filled with Cu. If necessary, a surface treatment (such as a blackening treatment) can be performed on the Cu exposed from the insulator after the electrolytic plating. A blackening layer (Cu oxide layer) is formed on the Cu plating during the blackening treatment. By the surface-roughened blackening layer being formed, the Cu plating and the protective films 38 and 58 are firmly joined by an anchor effect.

The conductor 53 may be electrically connected to one or both of the first planar coil 32 and the second planar coil 52 insofar as the conductor 53 can be used for electrolytic plating of the first planar coil 32 and the second planar coil 52. In the present embodiment, the conductor 53 is exposed from the surface of the element body 10 (that is, the end surface 10c). Accordingly, it is possible to determine the position of the bump electrode 60A or the position of the second island-shaped electrode 56 to which the conductor 53 is connected by confirming the position where the conductor 53 is exposed from the appearance of the coil component 1.

Figure 10A:
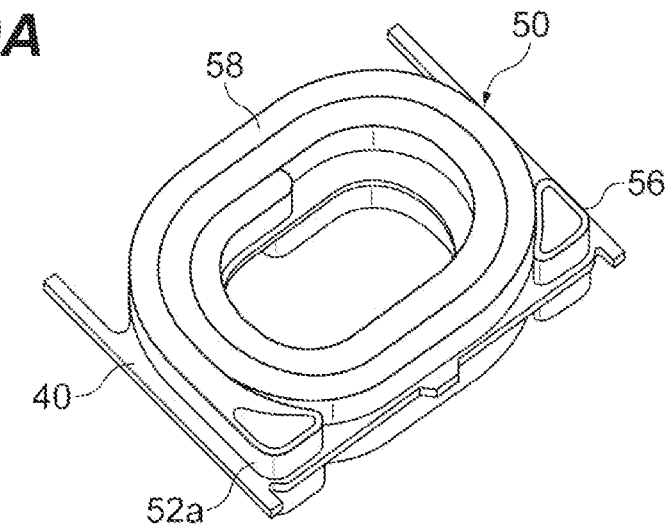
FIGS. 10A to 10C are diagrams illustrating processes of the method for manufacturing the coil component illustrated in FIG. 1.

The protective films 38 and 58 described above are subsequently formed as illustrated in FIG. 10A. The second island-shaped electrode 56 and the outside end portion 52a of the second planar coil 52 where the bump electrode 60 is formed are exposed from the protective film 58 in part or in whole without the protective film 58 being formed (or with the protective film 58 removed after formation). In a case where the blackening treatment described above is performed, the blackening layer on the second island-shaped electrode 56 and the outside end portion 52a of the second planar coil 52 in the region exposed from the protective film 58 is removed by a reduction treatment. The coil portion 20 described above is obtained through the process described above.

Figure 10B:
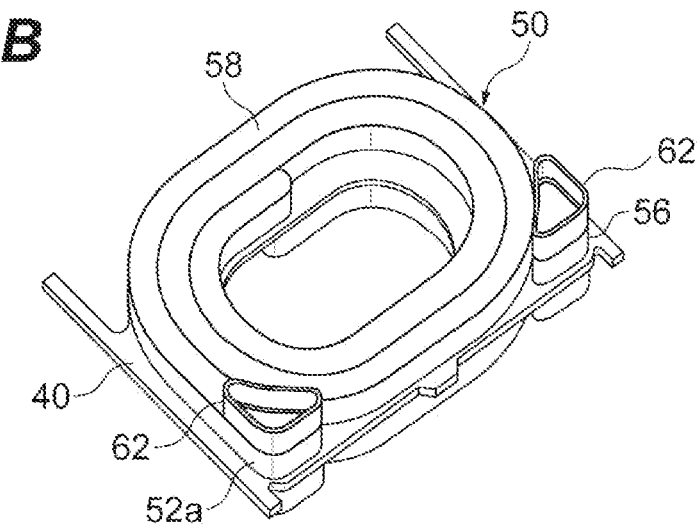

Subsequently, as illustrated in FIG. 10B, the tubular insulators 62 respectively surrounding the regions where the pair of bump electrodes 60 are formed (that is, the second island-shaped electrode 56 and the outside end portion 52a of the second planar coil 52) are formed. The insulator 62 can be formed by the thick film resist that is provided on the lower surface 40b side of the substrate 40 being patterned by known photolithography.

Subsequently, as illustrated in FIG. 10B, a resist 80 is formed on the lower surface 40b side of the substrate 40. The resist 80 has an opening 82 corresponding to the opening 42 of the substrate 40. In addition, the resist 80 has openings 84A and 84B respectively corresponding to the regions where the pair of bump electrodes 60 are formed (that is, the second island-shaped electrode 56 and the outside end portion 52a of the second planar coil 52).

Figure 10C:
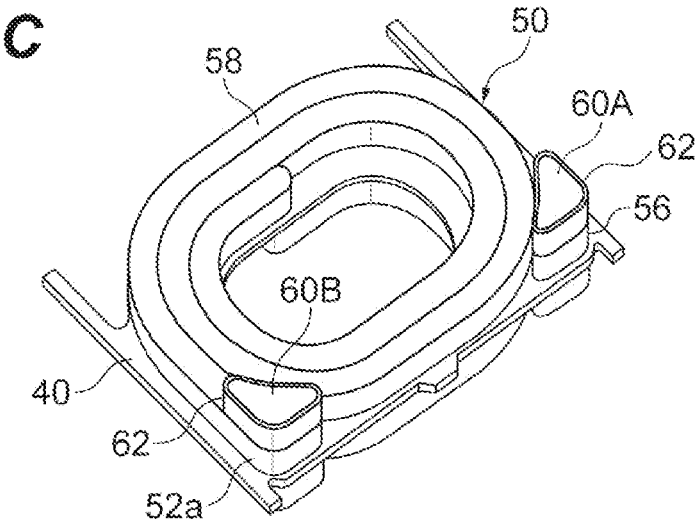

Further, as illustrated in FIG. 10C, electrolytic plating of Cu is performed by means of the second island-shaped electrode 56 and the outside end portion 52a of the second planar coil 52 exposed from the protective film 58 inside the insulator 62. At this time, the internal space of the insulator 62 is filled with Cu and the bump electrodes 60 are respectively formed in the insulators 62.

Subsequently, the element body 10 is configured by the coil portion 20 and the bump electrode 60 being integrally covered with a magnetic material by a known method. The recess portion 12 of the lower surface 10b of the element body 10 can be provided by the flat lower surface 10b being polished by means of a grinder or the like. Lastly, the manufacturing of the coil component 1 is completed by the terminal electrode 70 that has the above-described shape being formed on the lower surface 10b of the element body 10 and the wafer being divided into individual pieces. In the coil component 1, the resist that is used for the planar coils 32 and 52 to be formed remains as the first insulator 34 and the second insulator 54. The first insulator 34 and the second insulator 54 are so-called permanent resists.

Figure 11A:
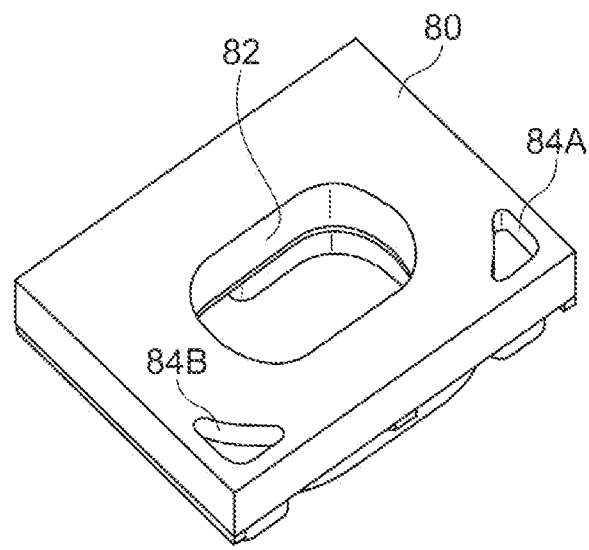
FIGS. 11A to 11C are diagrams illustrating processes of the method for manufacturing the coil component illustrated in FIG. 1.
Figure 11B:
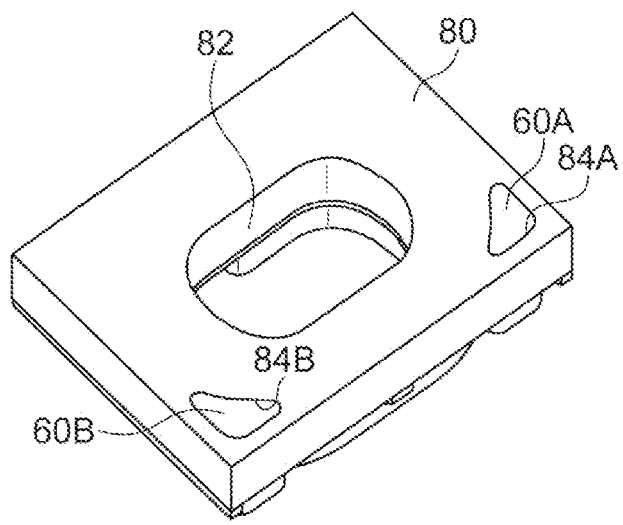
Figure 11C:
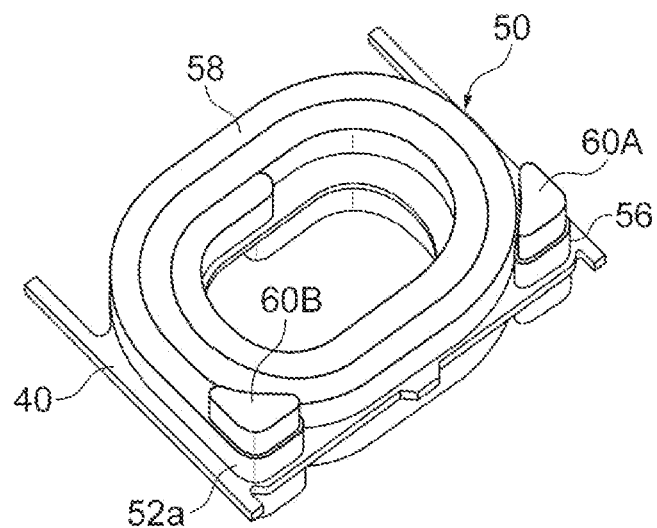

The insulator 62 can also be formed by the following method. In other words, as illustrated in FIG. 11A, the thick-film resist 80 is formed on the lower surface 40b side of the substrate 40. The resist 80 has the opening 82 corresponding to the opening 42 of the substrate 40. In addition, the resist 80 has the openings 84A and 84B respectively corresponding to the regions where the pair of bump electrodes 60 are formed (that is, the second island-shaped electrode 56 and the outside end portion 52a of the second planar coil 52). Subsequently, as illustrated in FIG. 11B, electrolytic plating of Cu is performed by means of the second island-shaped electrode 56 and the outside end portion 52a of the second planar coil 52 exposed from the protective film 58 in the openings 84A and 84B of the resist 80. At this time, the internal spaces of the openings 84A and 84B are filled with Cu and the bump electrodes 60 are respectively formed in the openings 84A and 84B. Further, as illustrated in FIG. 11C, the bump electrode 60 is exposed by the resist 80 being removed. Subsequently, uncured resin (such as epoxy resin) is applied by dipping or the like to the surface of the bump electrode 60 that is exposed, curing is performed, and the entire surface is covered with an insulator. Further, the insulator that covers the end surface of the bump electrode 60 (surface on the lower surface 10b side of the element body 10) is selectively removed by polishing or the like. The tubular insulator 62 covering the periphery of the bump electrode 60 is obtained as a result.

As described above, in the coil component 1, the terminal electrode 70 has the thickest portion P and the part thinner than the thickest portion P. Accordingly, an increase in solder fillet forming region occurs when the coil component 1 is solder-mounted onto a predetermined mounting substrate. In the coil component 1, mounting strength is improved as a result of the increase in solder fillet forming region. In addition, in the coil component 1, the thickest portion P overlaps the bump electrode 60 in a direction orthogonal to the lower surface 10b of the element body 10. Accordingly, the impact that is applied to the coil component 1 during the mounting onto the mounting substrate is reduced and the impact resistance of the coil component 1 is improved.

In addition, in the coil component 1, a part of each of the terminal electrodes 70A and 70B is provided in the recess portion 12. Accordingly, the length W1 of the terminal electrode 70A in the direction in which the end surfaces 10c and 10d face each other and the length W2 of the terminal electrode 70B in the direction in which the end surfaces 10c and 10d face each other are longer than in a case where a part of each of the terminal electrodes 70A and 70B does not reach the slope 12a of the recess portion 12 and insulation is sufficiently achieved between the terminal electrodes 70A and 70B.

Further, in the coil component 1, the first coil body 30 is provided with the first island-shaped electrode 36 as a dummy electrode. Accordingly, the pattern shape of the first coil body 30 and the pattern shape of the second coil body 50 provided with the second island-shaped electrode 56 are uniform. As a result, when the first coil body 30 and the second coil body 50 are simultaneously formed by plating on both surfaces of the substrate 40, a discrepancy in plating growth rate between the two coil bodies 30 and 50 is suppressed and the coil bodies 30 and 50 are capable of achieving plating growth at the same rate.

Here, Patent Literature 1 discloses a bottom surface terminal-type coil component in which a metal magnetic powder-containing resin constitutes an element body. In addition, FIG. 21 of Patent Literature 1 discloses a bump electrode extending from an end portion of a coil toward a terminal electrode provided on a chip bottom surface. The inventors have studied bump electrode insulation. As a result, the inventors have newly found a technique with which insulation can be enhanced between the bump electrode and the element body made of the metal magnetic powder-containing resin.

A coil component according to an aspect of the present disclosure includes an element body made of a metal magnetic powder-containing resin and having a lower surface facing a mounting substrate, a coil disposed in the element body and covered with a first insulating coating, a pair of terminal electrodes provided on the lower surface of the element body, a pair of bump electrodes extending in a direction intersecting with the lower surface of the element body and respectively interconnecting both end portions of the coil and the pair of terminal electrodes, and a second insulating coating covering at least coil-side end portions of the pair of bump electrodes in the element body.

In the coil component described above, the insulation between the coil and the element body made of the metal magnetic powder-containing resin is achieved by the first insulating coating. In addition, the insulation between the element body and the bump electrode is achieved by the second insulating coating. Accordingly, the insulation between the element body and the bump electrode is improved in the coil component described above.

In other words, in the coil component 1 according to the embodiment described above, the insulation between the coil 22 and the element body 10 made of the metal magnetic powder is achieved by the first insulating coating (that is, the first insulator 34, the second insulator 54, and the protective films 38 and 58). In addition, the insulation between the element body 10 and the bump electrode 60 is achieved by the insulator 62. Accordingly, the insulation between the element body 10 and the bump electrode 60 is improved in the coil component 1.

In the coil component according to another aspect, an end portion of the bump electrode on the lower surface side of the element body is exposed from the second insulating coating.

In the coil component according to another aspect, the end portion of the bump electrode on the lower surface side of the element body is an enlarged portion and a cross-sectional dimension of the enlarged portion in a plane parallel to the lower surface of the element body gradually increases toward the lower surface of the element body. Since the lower end of each bump electrode 60 is the enlarged portion 60a, the contact area between the bump electrode 60 and the terminal electrode 70 is increased. As a result, the bump electrode 60 and the terminal electrode 70 can be reliably interconnected.

The bump electrode 60 may extend in the direction orthogonal to the lower surface 10b of the element body 10 (that is, the thickness direction of the substrate 40) or may be inclined with respect to the direction orthogonal to the lower surface 10b of the element body 10 insofar as the direction intersects with the lower surface 10b of the element body 10.

In addition, Japanese Patent No. 6024243 (Patent Document 2) discloses a bottom surface terminal-type coil component provided with a substrate extending in parallel to a bottom surface provided with a terminal electrode, in which coil patterns are formed on both surfaces of the substrate. In the coil component, the inside dimension of a coil can be increased or the number of turns can be increased insofar as the outer peripheral dimension of the coil can be increased while the outer shape dimension of a chip is maintained. As a result, it is possible to improve coil characteristics such as inductance.

In the bottom surface terminal-type coil component described above, a bump electrode extending from an end portion of the coil toward the terminal electrode provided on the bottom surface of the chip hinders an increase in the outer peripheral dimension of the coil. The inventors have studied the bump electrode. As a result, the inventors have newly found a technique with which coil characteristics can be improved as a result of an increase in the outer peripheral dimension of the coil.

A coil component according to an aspect of the present disclosure includes an element body including a magnetic material and having an upper surface and a lower surface parallel to each other, a substrate disposed in the element body and extending in parallel to the upper and lower surfaces, a first coil body disposed in the element body, formed on an upper surface of the substrate, and having a first planar coil having a first connection end portion, a first extracting end portion, and a first turn portion interconnecting the first connection end portion and the first extracting end portion and a first insulator covering the first planar coil in the same layer as a layer where the first planar coil is formed, a second coil body disposed in the element body, formed on a lower surface of the substrate, and having a second planar coil having a second connection end portion connected to the first connection end portion of the first planar coil via the substrate, a second extracting end portion, and a second turn portion interconnecting the second connection end portion and the second extracting end portion and a second insulator covering the second planar coil in the same layer as a layer where the second planar coil is formed, a pair of terminal electrodes provided on the lower surface of the element body, and a pair of bump electrodes extending along a thickness direction of the substrate and respectively interconnecting the first and second extracting end portions of the first and second planar coils and the pair of terminal electrodes. Each of the pair of bump electrodes is positioned in a corner portion of a rectangular region including the first coil body and the second coil body when viewed from the thickness direction of the substrate. At least an end portion of one of the pair of bump electrodes on the substrate side overlaps neither the first turn portion of the first planar coil nor the second turn portion of the second planar coil in the thickness direction of the substrate and at least an end portion of the other bump electrode on the substrate side overlaps neither the first turn portion of the first planar coil nor the second turn portion of the second planar coil in the thickness direction of the substrate.

In the coil component described above, the bump electrode is positioned in the corner portion of the rectangular region including the first coil body and the second coil body, and thus the bump electrode does not hinder an increase in the outer peripheral dimensions of the first planar coil and the second planar coil. Accordingly, with the coil component described above, it is possible to improve coil characteristics by increasing the outer peripheral dimensions of the first planar coil and the second planar coil.

In other words, in the coil component 1 according to the embodiment described above, the bump electrode 60 is within the rectangular region 24 including the first coil body and the second coil body and is positioned in the corner portion of the rectangular region 24 when viewed from the thickness direction of the substrate 40. Accordingly, when the outer peripheral dimensions of the first planar coil 32 and the second planar coil 52 are increased in the range of the rectangular region 24, the bump electrode 60 does not hinder the increase. Accordingly, with the coil component 1, it is possible to improve coil characteristics by increasing the outer peripheral dimensions of the first planar coil 32 and the second planar coil 52.

In addition, in the coil component 1, the end portion of the bump electrode 60 on the substrate 40 side overlaps neither the first turn portion 32c nor the second turn portion 52c. Accordingly, a situation in which the magnetic flux generated in the first planar coil 32 and the second planar coil 52 is weakened by the bump electrode 60 is suppressed. In the coil component 1, since a magnetic flux is generated near the substrate 40 in particular, the coil component 1 can be designed such that at least the end portion on the substrate 40 side does not overlap the first turn portion 32c and the second turn portion 52c.

In the coil component according to another aspect, the rectangular region circumscribes the first coil body and the second coil body when viewed from the thickness direction of the substrate.

The coil component according to another aspect further includes a first island-shaped electrode provided in an upper surface-side region corresponding to a lower surface-side region where the second extracting end portion of the second planar coil is formed and not in contact with the first planar coil and a second island-shaped electrode provided in a lower surface-side region corresponding to an upper surface-side region where the first extracting end portion of the first planar coil is formed and not in contact with the second planar coil.

In the coil component according to another aspect, the bump electrode has an enlarged portion and a cross-sectional dimension of the enlarged portion in the plane orthogonal to the thickness direction of the substrate gradually increases toward the lower surface of the element body.

The coil component according to another aspect further includes a conductor connected to at least one of the first planar coil and the second planar coil and exposed from the element body.

In the coil component according to another aspect, a cross-sectional shape of the bump electrode in a plane orthogonal to the thickness direction of the substrate is a triangular shape along an outer periphery of the first turn portion or the second turn portion and two sides defining the corner portion of the rectangular region. In addition, in the coil component according to another aspect, the first extracting end portion and the bump electrode are electrically interconnected via a via conductor provided through the region of the substrate where the first extracting end portion is formed and a cross-sectional shape of the via conductor in the plane orthogonal to the thickness direction of the substrate is a triangular shape along the outer periphery of the first turn portion or the second turn portion and the two sides defining the corner portion of the rectangular region. In other words, in the coil component 1, the cross-sectional shape of each bump electrode 60 in the plane orthogonal to the thickness direction of the substrate 40 is a substantially triangular shape along the outer periphery of the first coil body 30 or the second coil body 50 and two sides defining a corner portion of the rectangular region 24. Accordingly, the bump electrode 60 having a large cross-sectional area can be realized so as to fit in the corner portion of the rectangular region 24. Likewise, the first island-shaped electrode 36, the second island-shaped electrode 56, and the via conductor 49 also have a substantially triangular cross-sectional shape along the outer periphery of the first coil body 30 or the second coil body 50 and two sides defining a corner portion of the rectangular region 24, and thus a large cross-sectional area is realized.

In the coil component according to another aspect, a distance between the substrate and the lower surface of the element body is shorter than a distance between the substrate and the upper surface of the element body. In other words, in the coil component 1, the distance between the substrate 40 and the lower surface 10*b* of the element body 10 is shorter than the distance between the substrate 40 and the upper surface 10*a* of the element body 10. Accordingly, the bump electrode 60 is shorter than in a case where the substrate 40 is at the same distance from the upper surface 10*a* and the lower surface 10*b* of the element body 10. It is possible to reduce the direct current resistance in the bump electrode 60 by shortening the bump electrode 60.

The present disclosure is not limited to the embodiments described above and can be variously modified. For example, the electronic component is not limited to a coil component and the electronic component may be a capacitor, a varistor, or the like. In addition, the pattern shapes of the first and second coil bodies of the coil portion may be identical to each other or may be partially different from each other. Further, the distance between the substrate and the element body lower surface may be equal to the distance between the substrate and the element body upper surface.

What is claimed is:

1. A coil component comprising:
    an element body including a magnetic material and having an upper surface and a lower surface parallel to each other;
    a substrate disposed in the element body and extending in parallel to the upper and lower surfaces;
    a first coil body disposed in the element body, formed on an upper surface of the substrate, and having a first planar coil having a first connection end portion, a first extracting end portion, and a first turn portion interconnecting the first connection end portion and the first extracting end portion and a first insulator covering the first planar coil in the same layer as a layer where the first planar coil is formed;
    a second coil body disposed in the element body, formed on a lower surface of the substrate, and having a second planar coil having a second connection end portion connected to the first connection end portion of the first planar coil via the substrate, a second extracting end portion, and a second turn portion interconnecting the second connection end portion and the second extracting end portion and a second insulator covering the second planar coil in the same layer as a layer where the second planar coil is formed;
    a pair of terminal electrodes provided on the lower surface of the element body; and
    a pair of bump electrodes extending along a thickness direction of the substrate and respectively interconnecting the first and second extracting end portions of the first and second planar coils and the pair of terminal electrodes, wherein
    each of the pair of bump electrodes is positioned in a corner portion of a rectangular region including the first coil body and the second coil body when viewed from the thickness direction of the substrate, and
    at least an end portion of one of the pair of bump electrodes on the substrate side overlaps neither the first turn portion of the first planar coil nor the second turn portion of the second planar coil in the thickness direction of the substrate and at least an end portion of the other bump electrode on the substrate side overlaps neither the first turn portion of the first planar coil nor the second turn portion of the second planar coil in the thickness direction of the substrate.

2. The coil component according to claim 1, wherein the rectangular region circumscribes the first coil body and the second coil body when viewed from the thickness direction of the substrate.

3. The coil component according to claim 1, further comprising:
    a first island-shaped electrode provided in an upper surface-side region corresponding to a lower surface-side region where the second extracting end portion of the second planar coil is formed and not in contact with the first planar coil; and
    a second island-shaped electrode provided in a lower surface-side region corresponding to an upper surface-side region where the first extracting end portion of the first planar coil is formed and not in contact with the second planar coil.

4. The coil component according to claim 1, wherein a cross-sectional shape of the bump electrode in a plane orthogonal to the thickness direction of the substrate is a triangular shape along an outer periphery of the first turn portion or the second turn portion and two sides defining the corner portion of the rectangular region.

5. The coil component according to claim 1, wherein
    the first extracting end portion and the bump electrode are electrically interconnected via a via conductor provided through the region of the substrate where the first extracting end portion is formed, and
    a cross-sectional shape of the via conductor in the plane orthogonal to the thickness direction of the substrate is a triangular shape along the outer periphery of the first turn portion or the second turn portion and the two sides defining the corner portion of the rectangular region.

6. The coil component according to claim 1, wherein the bump electrode has an enlarged portion and a cross-sectional dimension of the enlarged portion in the plane orthogonal to the thickness direction of the substrate gradually increases toward the lower surface of the element body.

7. The coil component according to claim 1, wherein a distance between the substrate and the lower surface of the element body is shorter than a distance between the substrate and the upper surface of the element body.

8. The coil component according to claim 1, further comprising a conductor connected to at least one of the first planar coil and the second planar coil and exposed from the element body.

* * * * *